(12) United States Patent
Choi et al.

(10) Patent No.: US 10,191,206 B2
(45) Date of Patent: Jan. 29, 2019

(54) LIGHT SOURCE CIRCUIT UNIT AND LIGHTING DEVICE COMPRISING SAME

(71) Applicant: LG INNOTEK CO., LTD., Seoul (KR)

(72) Inventors: Man Hue Choi, Seoul (KR); Min Jae Kim, Seoul (KR); Bi Yi Kim, Seoul (KR); Se Woong Na, Seoul (KR); Hyun Gyu Park, Seoul (KR); In Hee Cho, Seoul (KR); Seung Kwon Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 187 days.

(21) Appl. No.: 14/901,028

(22) PCT Filed: Jun. 11, 2014

(86) PCT No.: PCT/KR2014/005117
§ 371 (c)(1),
(2) Date: Dec. 27, 2015

(87) PCT Pub. No.: WO2014/208907
PCT Pub. Date: Dec. 31, 2014

(65) Prior Publication Data
US 2017/0003441 A1    Jan. 5, 2017

(30) Foreign Application Priority Data

Jun. 27, 2013   (KR) .................... 10-2013-0074643

(51) Int. Cl.
*G02F 1/00*     (2006.01)
*F21V 8/00*     (2006.01)
(Continued)

(52) U.S. Cl.
CPC ......... *G02B 6/0083* (2013.01); *G02B 6/0085* (2013.01); *G02B 6/0091* (2013.01);
(Continued)

(58) Field of Classification Search
CPC .... G02B 6/0083; G02B 6/009; G02B 6/0091; G02B 6/0085; H05K 1/021; H05K 1/05;
(Continued)

(56) References Cited

U.S. PATENT DOCUMENTS

2005/0078459 A1* 4/2005 Yeon .................. G02F 1/13452
                                                                361/749
2005/0179850 A1    8/2005 Du
(Continued)

FOREIGN PATENT DOCUMENTS

JP        2014077871    * 10/2012 ......... G02F 1/13357
KR    10-2013-0023925 A    3/2013
(Continued)

OTHER PUBLICATIONS

SIPO Office Action for Chinese Application No. 201480042242.5 dated Jan. 26, 2017, which corresponds to the above-referenced U.S. application.

*Primary Examiner* — Zheng Song
(74) *Attorney, Agent, or Firm* — LRK Patent Law Firm

(57) ABSTRACT

A light source circuit unit and a lighting device including the light source circuit unit that are configured such that a bent-type metal substrate is formed on an upper surface of the printed circuit board so that the occurrence of a defect due to circuit damage at a bent part upon bending the substrate can be prevented, and slimness and a heat-dissipation property of a device can be improved. The light source circuit board includes: a substrate having a first part with at least one opening portion, and a second part bent from the first part; a printed circuit board on one surface of the substrate; and a light source element mounted to the printed circuit board and inserted into the opening portion, the light source element emitting light to an opposing side of the substrate.

16 Claims, 4 Drawing Sheets

(51) Int. Cl.
*H05K 1/18* (2006.01)
*H05K 3/00* (2006.01)
*H05K 1/02* (2006.01)
*H05K 1/05* (2006.01)
*H05K 1/11* (2006.01)
*G02F 1/1335* (2006.01)

(52) U.S. Cl.
CPC ............... *H05K 1/021* (2013.01); *H05K 1/05* (2013.01); *H05K 1/111* (2013.01); *H05K 1/189* (2013.01); *H05K 3/0061* (2013.01); *G02F 1/133615* (2013.01); *H05K 2201/10106* (2013.01); *H05K 2201/10128* (2013.01); *H05K 2201/2009* (2013.01)

(58) Field of Classification Search
CPC ....... H05K 3/0061; H05K 2201/10106; H05K 2201/10128; G02F 1/133608; G02F 2001/133612
See application file for complete search history.

(56) References Cited

U.S. PATENT DOCUMENTS

| | | | | |
|---|---|---|---|---|
| 2008/0074902 A1* | 3/2008 | Oh | ................... | G02B 6/0068 362/612 |
| 2008/0180972 A1* | 7/2008 | Sakamoto | ............. | G02B 6/009 362/613 |
| 2009/0032295 A1* | 2/2009 | Okajima | ............. | H05K 1/0203 174/260 |
| 2009/0066877 A1* | 3/2009 | Abe | ..................... | G02B 6/0021 349/62 |
| 2011/0025944 A1* | 2/2011 | Lee | ..................... | G02B 6/0036 349/61 |
| 2011/0116011 A1* | 5/2011 | Isobe | ..................... | F21V 19/04 349/62 |
| 2011/0273904 A1* | 11/2011 | Tajiri | ................... | F21V 29/004 362/606 |
| 2011/0310327 A1* | 12/2011 | He | ..................... | G02B 6/0031 349/61 |
| 2012/0105762 A1* | 5/2012 | Que | ................... | G02F 1/133615 349/60 |
| 2012/0242929 A1* | 9/2012 | Ohyama | ............. | G02B 6/0068 349/61 |
| 2012/0287368 A1* | 11/2012 | Que | ..................... | G02B 6/0086 349/58 |
| 2012/0294033 A1* | 11/2012 | Chen | ................... | G02B 6/0031 362/606 |
| 2013/0128189 A1* | 5/2013 | Hu | ..................... | G02B 6/0031 349/65 |
| 2013/0271691 A1* | 10/2013 | Yu | ..................... | G09F 13/04 349/58 |
| 2014/0098322 A1* | 4/2014 | Tokuyama | ........... | G02B 6/0073 349/58 |
| 2014/0133178 A1* | 5/2014 | Kwon | ................. | G02B 6/0023 362/609 |
| 2014/0133179 A1* | 5/2014 | Franklin | ............. | G02B 6/0093 362/612 |

FOREIGN PATENT DOCUMENTS

| | | |
|---|---|---|
| KR | 10-2013-0025114 A | 3/2013 |
| KR | 10-2013-0037267 A | 4/2013 |

* cited by examiner

LIGHT SOURCE CIRCUIT UNIT AND LIGHTING DEVICE COMPRISING SAME

CROSS-REFERENCE TO RELATED APPLICATIONS

This application is a U.S. National Stage entry from International Application No. PCT/KR2014/005117, filed on Jun. 11, 2014, which claims priority to Korean Patent Application No. 10-2013-0074643, filed on Jun. 27, 2013, the disclosures of each of which are incorporated herein by reference herein in their entirety.

TECHNICAL FIELD

Embodiments of the present invention relate to lighting devices, and more specifically, to a light source circuit unit and a lighting device including the light source circuit unit that are configured such that a bent-type metal substrate is formed on an upper surface of a printed circuit board so that the occurrence of a defect due to circuit damage at a bent part upon bending the substrate can be prevented, and slimness of a device can be realized.

BACKGROUND ART

According to the development of electronic equipment industry, lighting devices including LEDs, PDPs, AMO-LEDs and the like have been developed, and image devices, computers, mobile communication terminal or the like including the lighting devices have been also developed.

A printed circuit board to which a light source is mounted and which electrically connects electronic components, such as the light source and the like is used in the lighting devices. In particular, a bent-type substrate may be used so that light emitted from a light source element is incident to a side of a light guide plate.

However, when the bent-type substrate is manufactured, a printed circuit board on the substrate may be damaged at a bent part resulting from bending, namely, an insulating layer or a conductive pattern may be pressed or may be torn. Thus, it is problematic in that an electrical defect or a defect in appearance (the occurrence of foreign substances) occurs due to such damage.

In addition, the light guide plate is expanded due to heat generated from the light source element so that the light source element comes into contact with the expanded light guide plate. Thus, it is also problematic in that the light source element is damaged due to such contact.

DISCLOSURE OF INVENTION

Technical Problem

The present invention has been devised in order to solve the above problems, and an object of the present invention is to provide a light source circuit unit and a lighting device including the light source circuit unit that are configured such that a metal substrate having a light source inserting hole is disposed on an upper surface of a printed circuit board including a first bent part such that the bent-type metal substrate is arranged between a light guide plate and the printed circuit board on the basis of a position of the light guide plate, so that the occurrence of a defect due to circuit damage at a bent part upon bending the substrate can be prevented; an electrical defect or a defect in appearance resulting from circuit damage can be blocked; the light source element can be prevented from being damaged due to expansion of the light guide plate, and slimness of a device can be realized.

Solution to Problem

In order to solve the problems, according to an aspect of the present invention, a light source unit may include: at least one light source; a printed circuit board including a first bent part and adopted to mount the light source; and a metal substrate formed on an upper surface of the printed circuit board. In other words, the light source circuit unit may include: a substrate having a first part with at least one opening portion, and a second part bent from the first part; a printed circuit board on one surface of the substrate; and a light source element mounted to the printed circuit board and inserted into the opening portion, the light source element emitting light to an opposing side of the substrate.

According to the light source circuit unit of the present embodiment, the printed circuit board may include: a pad part formed to extend from a first bent in one direction and adopted to mount the light source element; and a string part formed to extend from the first bent part in another direction and having a string wiring for transmitting an electrical signal to the light source element.

According to the light source circuit unit of the present embodiment, the metal substrate may include a light source inserting hole into which a second bent part and the light source element.

According to the light source circuit unit of the present embodiment, the metal substrate may contain at least one material selected from among Al, Cu, Ag, Au, Cr, Mo, Mg, and Ni.

According to the light source circuit unit of the present embodiment, the first bent part and the second bent part may match with each other.

According to the light source circuit unit of the present embodiment, a height of the light source inserting hole may be greater than a thickness of the light source element.

According to the light source circuit unit of the present embodiment, the printed circuit board may be a flexible printed circuit board.

In addition, according to another aspect of the present invention, a lighting device may include: a light source circuit described above; and a light guide plate for guiding light emitted from a light source of the light source circuit unit. In other words, the lighting device may include: a light source circuit unit; and a light guide plate to which a substrate of the light source circuit unit is mounted, and which is disposed on a light-emitting surface of a light source element of the light source circuit unit, the light guide plate guiding light emitted from the light source element. In this case, the light source circuit unit may include: the substrate having a first part with at least one opening portion, and a second part bent from the first part; a printed circuit board on one surface of the substrate; and the light source element mounted to the printed circuit board and inserted into the opening portion, the light source element emitting light to an opposing side of the substrate.

Advantageous Effects of Invention

According to some embodiments of the present invention, since a metal substrate in which a light source inserting hole is formed on an upper surface of a printed circuit board, the printed circuit board can be prevented from being damaged at a bent part when a substrate is bent, and a light source can be protected by preventing contact due to expansion of a light guide plate. Furthermore, slimness and a heat-dissipation property of a light source circuit unit can be improved.

BEST MODE FOR CARRYING OUT THE INVENTION

Figure 1:
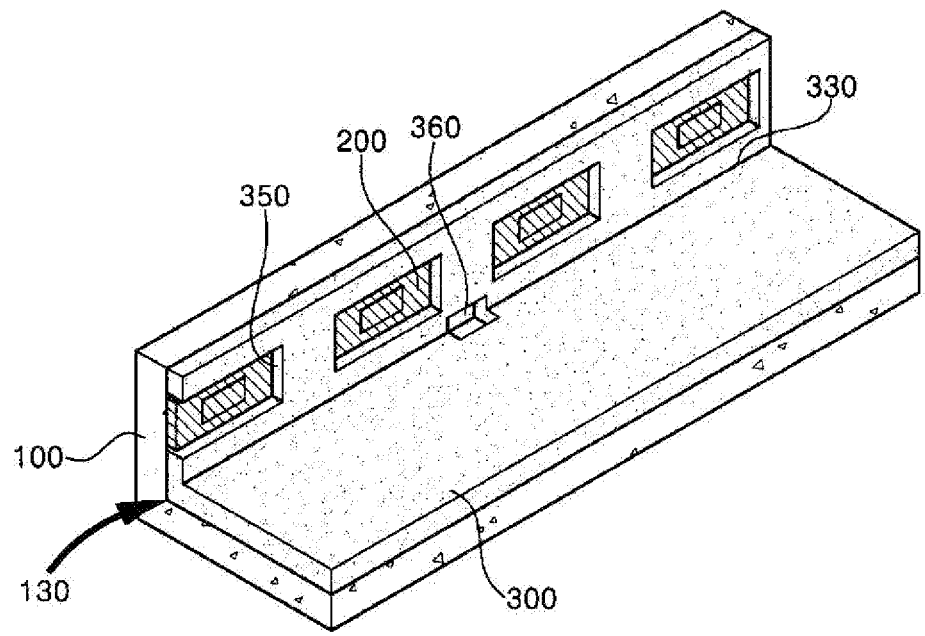
FIG. 1 is a view illustrating a schematic structure of a light source circuit unit according to an embodiment of the present invention.

Hereinafter, embodiments of the present invention that an ordinary person skilled in the art can easily implement will be described with reference to the accompanying drawings. The embodiments in the specification and the constructions shown in the drawings are provided as a preferred embodiment of the present invention, and it should be understood that there may be various equivalents and modifications which could substitute at the time of filing. In addition, when it comes to the operation principle of the preferred embodiments of the present invention, when the known functions or functions are seemed to make unclear the subject matters of the present invention, they will be omitted from the descriptions of the invention. The terms below are defined in consideration of the functions of the present invention, and the meaning of each term should be interpreted by judging the whole parts of the present specification, and the elements having the similar functions and operations of the drawings are given the same reference numerals.

Embodiments of the present invention relate to light source circuit units and lighting devices including the light source circuit units. The embodiments of the present invention is intended to provide a structure in which a metal substrate having a light source inserting hole is formed on an upper surface of a printed circuit board so that the occurrence of a defect due to damage to the printed circuit board at a bent part can be prevented when the substrate is bent, and the slimness and heat-dissipation property of a device can be improved.

FIG. 1 is a view illustrating a schematic structure of a light source circuit unit according to an embodiment of the present invention.

Referring to FIG. 1, a light source circuit unit according to the present invention includes: at least one light source element 200; a printed circuit board 100 to which the light source element 200 is mounted, and which has a first bent part 130; and a bending-type metal substrate 300 disposed on an upper surface of the printed circuit board 100.

It is preferable that the light source element 200 be a semiconductor light source including a light emitting diode having small power consumption and excellent durability or the like. However, the light source element may be any lamp, such as a halogen lamp, a discharge lamp, or the like and may be mounted to pad part of the printed circuit board 100 which will be described later, there by emitting light to the side of a light guide plate.

The printed circuit board 100, which is a bending-type printed circuit board, may include: a pad part which is formed to extend from the first bent part 130 in a first direction and to which the light source element 200 is mounted; and a string part formed to extend from the first bent part in a second direction, and having a string wiring transmitting an electrical signal to the light source element 200. That is, the printed circuit board 100 may include the pad part to which light source element 200 is mount, and the string part having the string wiring based on the first bent part 130.

In this case, the printed circuit board 100 may be a flexible printed circuit board in which a flexible copper clad laminate (FCCL) having flexibility and ductility is used.

The metal substrate 300 is formed on the upper surface of the printed circuit board 100, and includes a second bent part 330 and a light source inserting hole 350 into which the light source element 200 is inserted. In the present embodiment thanks to the structure in which the light source element 200 is inserted into the light source inserting hole 350, the light source element 200 may be prevented from being damaged due to expansion of the light guide plate.

The second bent part 330 formed at the metal substrate 300 is matched with the first bent part 130 formed at the printed circuit board 100. That is, the metal substrate 300 is disposed on the upper surface of the printed circuit board 100 such that the metal substrate corresponds to the pad part and the string part by being bent at a predetermined angle based on the first bent part 130 of the printed circuit board 100. In other words, the metal substrate 300 is bent and is then disposed on an upper surface of the pad part and an upper surface of the string part based on the second bent part 330. A bending angle of the metal substrate 300 may be identical to a bending angle of the printed circuit board 100.

The metal substrate 300 may contain at least one material selected from among Al, Cu, Ag, Au, Cr, Mo, Mg, and Ni which are metals having high thermal conductivity. Since such a metal having high thermal conductivity is used, heat generated from the light source element may be easily emitted via the metal substrate 300 so that a heat dissipation property can be improved.

A bent hole 360 may be formed at the metal substrate 300. The bent hole 360 may prevent the metal substrate 300 from being distorted when the metal substrate 300 is bent in an L-like shape.

According to the present embodiment, the metal substrate 300 is disposed on the upper surface of the printed circuit board, and the first bent part 130 is formed so that an insulating layer or a wiring of the printed circuit board can be prevented from being damaged such as being torn or being squashed, and the occurrence of an electrical defect or abnormal appearance resulting from damage can be also prevented.

Figure 2:
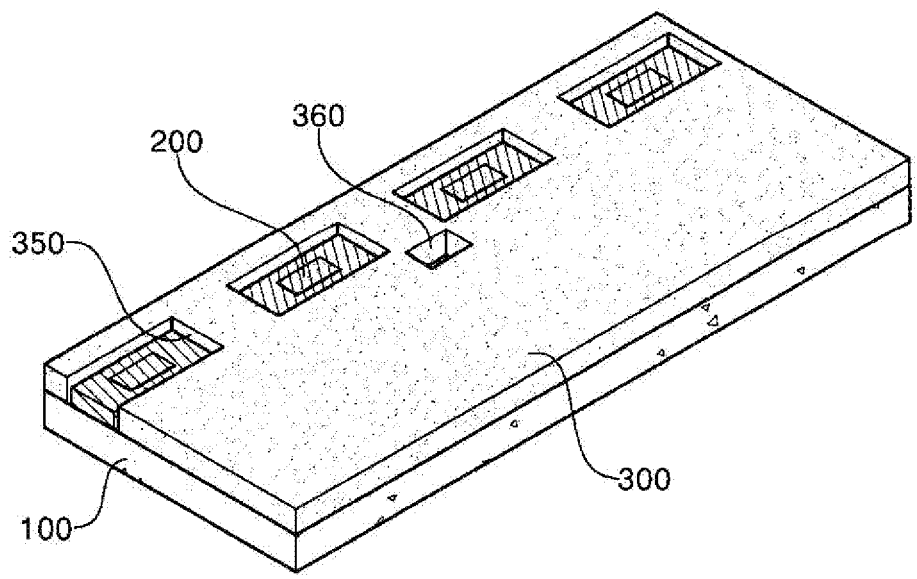
FIG. 2 is a perspective view illustrating the form of a substrate of the light source circuit unit of FIG. 1 before the substrate is bent.

FIG. 2 is a perspective view illustrating the form of a substrate of the light source circuit unit of FIG. 1 before the substrate is bent.

Referring to FIG. 2, the light source circuit unit according to the present embodiment has a flat form before the metal substrate is bent. That is, the light source circuit unit includes the metal substrate 300 that enables the light source element 200 to be mounted on the upper surface of the printed circuit board 100 and is disposed on the upper surface of the printed circuit board 100 such that the light source element 200 is inserted into an opening portion, namely, the light source inserting hole 350.

According to the present embodiment, when the metal substrate 300 is bent in an L-like shape in such a manner that pressure is applied to a bending mechanism in the state where the bending mechanism is placed on an upper surface of the metal substrate 300 such that the bent hole 360 extends to cross from one direction, the printed circuit board 100 may be prevented from being damaged at a first bent part or a second bent part. In this case, when the printed circuit board 100 is a flexible printed circuit board, the printed circuit board 100 may be more efficiently prevented from being damaged.

Figure 3:
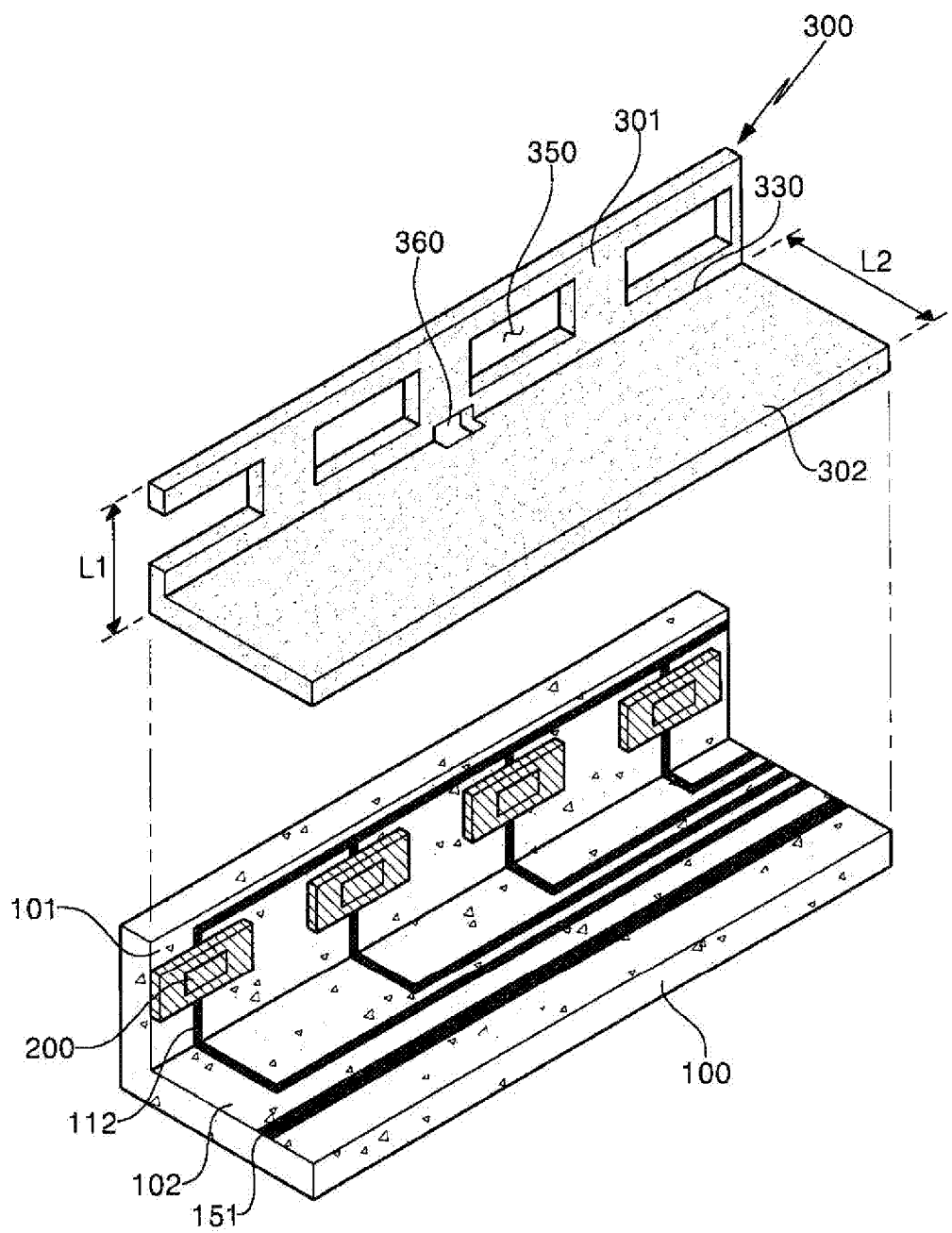
FIG. 3 is an exploded perspective view of the light source circuit unit of FIG. 1.

FIG. 3 is an exploded perspective view of the light source circuit unit of FIG. 1.

Referring to FIG. 3, in the light source circuit unit according to the present embodiment, the metal substrate 300 is disposed on the upper surface of the printed circuit board 100 and is bent. A first part 301 of the metal substrate extending in a first direction has a first length L1 and a second part 302 of the metal substrate extending in a second direction has a second length L2.

In this case, the printed circuit board 100 includes: the light source element 200 mounted to a mounting pad of a first part 101 arranged on an upper surface of the printed circuit board; and a connection wiring 112 connecting the mounting pad and a string wiring 151 to each other. A portion of the connection wiring 112, and the string wiring 151 are disposed on the string part corresponding to a second part 102 arranged on a lower surface of the printed circuit board 100.

According to the metal substrate 300 of the present embodiment, since an LED package, which is the light source element 200, may replace a stopper by being disposed not to protrude in the second direction, the light source circuit unit may be implemented to have a narrow width. Furthermore, since the string wiring 151 of the printed circuit board 100 may be arranged at a lower portion of the metal substrate 300, the light source circuit unit having a slim structure may be implemented.

Figure 4:
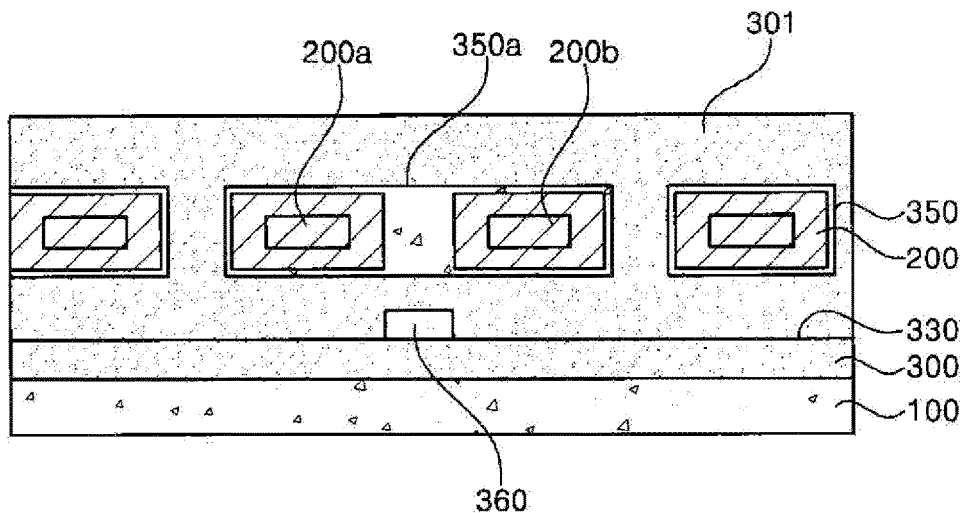
FIG. 4 is a front view illustrating a modified example of the light source circuit unit of FIG. 1.

FIG. 4 is a front view illustrating a modified example of the light source circuit unit of FIG. 1.

Referring to FIG. 4, the light source circuit unit according to the present embodiment includes: the substrate 300 having a first part including a first opening portion 350 and a second opening portion 350a corresponding to the light source inserting hole, and a second part bent from the first part; the printed circuit board on one surface (corresponding to a lower surface) of the substrate 300; and the light source element 200 mounted to the printed circuit board 100 and inserted into the first and second opening portions, the light source element emitting light to an opposing side of the substrate 300. In this case, the substrate 300 refers to the metal substrate.

The substrate 300 has the second opening portion 350a into which the plurality of light source elements 200a, 200b are inserted together. A size of the second opening portion 350a is different from that of the first opening portion 350. In the present embodiment, the size of the second opening portion is larger than that of the first opening portion 350. As such, according to the present embodiment, the sizes of the opening portions may be changed according to a size or a length of the light source circuit unit.

Figure 5:
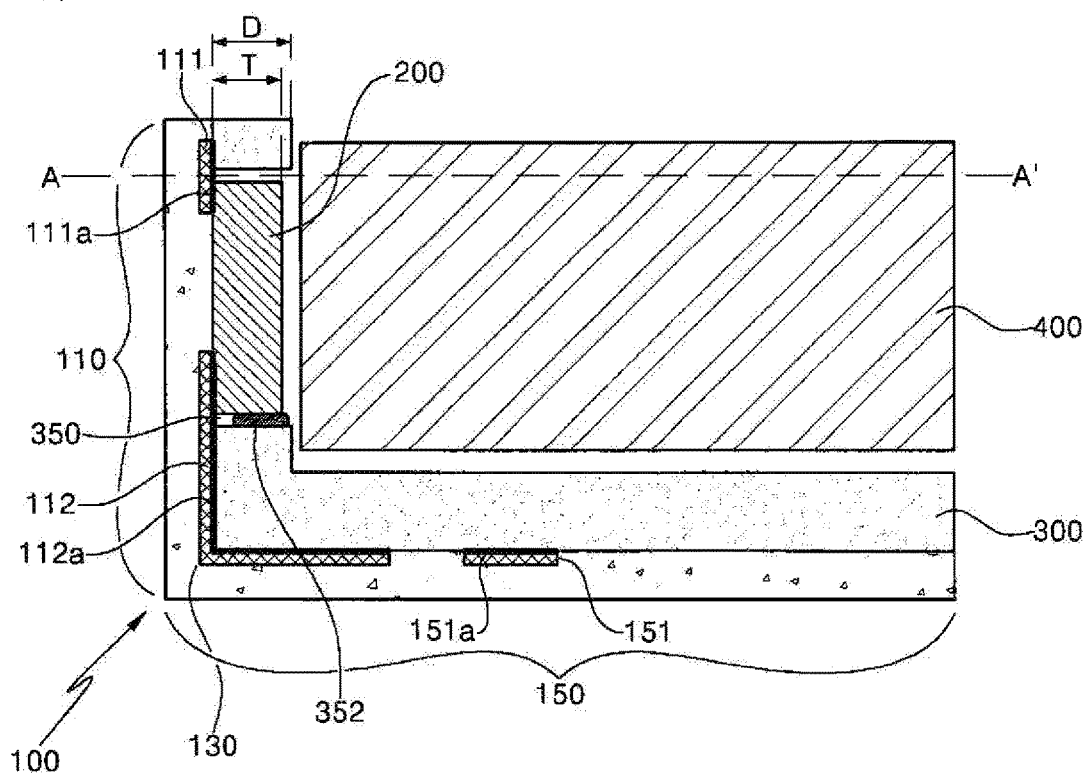
FIG. 5 is a cross-sectional view of a lighting device according to another embodiment of the present invention.
Figure 6:
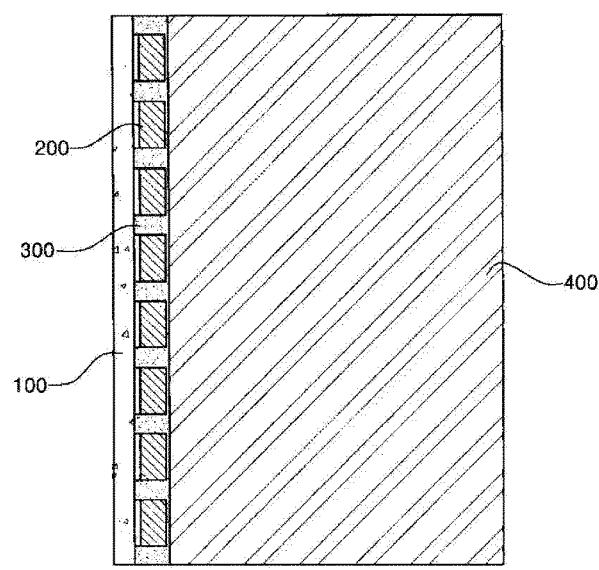
FIG. 6 is a plan view of the lighting device of FIG. 5.

FIG. 5 is a cross-sectional view of a lighting device according to another embodiment of the present invention, and FIG. 6 is a plan view of the lighting device of FIG. 5. FIG. 6 may correspond to a cross-sectional view taken along lines A-A' of the lighting device of FIG. 5.

Referring to FIGS. 5 and 6, a lighting device according to the present embodiment may be formed by providing a light guide plate 400 for guiding light emitted from the light source element of the light source circuit unit of FIG. 1.

The light source inserting hole 350 into which the light source element mounted to a pad part 110 of the printed circuit board 100 200 is inserted is formed at the metal substrate 300 disposed on an upper surface of the printed circuit board 100. A height D of the light source inserting hole 350 may be formed greater than a thickness T of the light source element 200.

Like the present embodiment, in the case where the light source element 200 is mounted to the pad part 110 of the printed circuit board 100, namely, in the case where the light source element 200 is mounted to the pad part on the upper surface of the printed circuit board 100 to emit light to a side of the light guide plate 400, the light guide plate 400 is expanded by heat generated from the light source element 200. Due to this, since the light source element 200 comes into contact with the expanded light guide plate 400, the light source element 200 may be damaged due to the contact.

In order to prevent the light source element 200 from being damaged due to such expansion of the light guide plate 400, a stopper may be formed at a position spaced apart from the light source element 200. However, it is problematic in that an increase of costs resulting from the manufacture of a separate stopper, and the addition of a separate process are caused.

Accordingly, instead of providing a separate stopper as an additional element, in the present embodiment, the metal substrate 300 having the light source inserting hole 350 is disposed on the upper surface of the printed circuit board 100 such that the height D of the light source inserting hole 350 is formed greater than the thickness T of the light source element 200. Thus, the light source element 200 can be prevented from being damaged due to expansion of the light guide plate 400.

In addition, as described above, an insulating layer or a wiring can be prevented from being damaged at the bent part 130 of the printed circuit board 100 when the substrate 300 is bent. Furthermore, since a material having high electrical conductivity is used in the metal substrate, a heat-dissipation property can be improved, and since a stopper is not used, costs can be reduced and the light source circuit unit can be thinner.

In order to strengthen a heat dissipation property, at least one portion between the light source element 200 and an inner wall of the light source inserting hole 350 into which the light source element 200 is inserted may be filled with a thermal conductive filler 352. The thermal conductive filler 352 enables the light source element 200 and the metal substrate 300 not to come into contact with each other by a predetermined distance and also enables heat generated from the light source element 200 to be easily transmitted to the metal substrate 300.

In addition, as can be seen from the printed circuit board 100 illustrated in FIG. 5, the printed circuit board 100 according to the present embodiment includes; a mounting pad 111 to which the light source element 200 is mounted; the string wiring 151 supplying an electrical signal to the light source element 200; and the connection wiring 112 connecting the mounting pad 111 and the string wiring 151. In this case, insulating layers 111a, 112a, 151a are formed on a surface of the mounting pad 111, a surface of the connection wiring 112, and a surface of the string wiring 151, respectively so that the occurrence of short-circuit with an element having conductivity, such as the substrate 300 or the like, can be prevented.

According to the present embodiment, the mounting pad 111 is disposed on the pad part 110, and the string wiring 151 is disposed on the string part 150 so that the light source circuit unit can have a slim structure.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

DESCRIPTION OF THE REFERENCE NUMERALS

100: Printed circuit board
110: Pad part
111: Mounting pad
112: connection wiring
130: First bent part
150: String part
151: String wiring
200: Light source element
300: Metal substrate
330: Second bent part
350: Light source inserting hole
400: Light guide plate

What is claimed is:

1. A light source circuit unit comprising:
    a printed circuit board comprising:
        a pad part extending from a first bent part in a first direction; and
        a string part extending from the first bent part in a second direction perpendicular to the first direction and having a string wiring;
    a substrate comprising:
        a first part disposed on the pad part and having at least one opening portion; and
        a second part bent from the first part at a second bent part which is matched with the first bent part and disposed on the string part; and
    a light source element mounted on the pad part by inserting the light source element through the at least one opening portion, and emitting light to an opposing side of the substrate,
    wherein a connection wiring for connecting the pad part and the string wiring is disposed on the printed circuit board,
    wherein the substrate has at least one bending hole formed on the second bent part along a portion where the connection wiring is not disposed,
    wherein the string wiring is disposed to be spaced apart from the first bent part along a longitudinal direction of the string part and parallel to the first bent part, and
    wherein the connection wiring extends from the light source element to the string part through the first bent part, and transmits an electrical signal from the string wiring to the light source element.

2. The light source circuit unit of claim 1, wherein the substrate is made of a metallic material.

3. The light source circuit unit of claim 1, wherein the printed circuit board is a flexible printed circuit board.

4. The light source circuit unit of claim 1, wherein a thickness of the first part with the opening portion is larger than a thickness of the light source element.

5. The light source circuit unit of claim 4, wherein at least one light source element is received in the opening portion.

6. The light source circuit unit of claim 1, wherein the substrate contains at least one material having high thermal conductivity selected from among Al, Cu, Ag, Au, Cr, Mo, Mg, and Ni.

7. The light source circuit unit of claim 1, further comprising an insulating layer disposed on the string wiring and the connection wiring.

8. The light source circuit unit of claim 1, wherein the light source element does not come into contact with the substrate.

9. The light source circuit unit of claim 8, further comprising a conductive filler disposed in the opening portion of the first part and between the substrate and the light source element.

10. The light source circuit unit of claim 9, wherein the conductive filler is a thermal conductive material.

11. A lighting device comprising:
    a light source circuit unit; and
    a light guide plate on which a substrate of the light source circuit unit is mounted, and which is disposed with a gap on a light-emitting surface of a light source element of the light source circuit unit, the light guide plate guiding light emitted from the light source element,
    wherein the light source circuit unit comprises:
    a printed circuit board comprising:
        a pad part extending from a first bent part in a first direction; and
        a string part extending from the first bent part in a second direction perpendicular to the first direction and having a string wiring;
    a substrate comprising:
        a first part disposed on the pad part and having at least one opening portion; and
        a second part bent from the first part at a second bent part which is matched with the first bent part and disposed on the string part; and
    the light source element mounted on the pad part through the opening portion, and emitting light to an opposing side of the substrate,
    wherein a connection wiring for connecting the pad part and the string wiring is disposed on the printed circuit board,
    wherein the substrate has at least one bending hole formed on the second bent part along a portion where the connection wiring is not disposed,
    wherein the string wiring is disposed to be spaced apart from the first bent part along a longitudinal direction of the string part and parallel to the first bent part, and
    wherein the connection wiring extends from the light source element to the string part through the first belt part, and transmits an electrical signal from the string wiring to the light source element.

12. The lighting device of claim 11, wherein the substrate is made of a metallic material, and the printed circuit board is a flexible printed circuit board.

13. The lighting device of claim 11, wherein a thickness of the first part with the opening portion is larger than a thickness of the light source element, and at least one light source element is received in the opening portion.

14. The lighting device of claim 11, wherein the substrate contains at least one material having high thermal conductivity selected from among Al, Cu, Ag, Au, Cr, Mo, Mg, and Ni.

15. The lighting device of claim 11, further comprising an insulating layer disposed on the string wiring and the connection wiring.

16. The lighting device of claim 11, further comprising a conductive filler disposed in the opening portion of the first part and between the substrate and the light source element.

* * * * *